United States Patent [19]
McClure

[11] Patent Number: 5,835,427
[45] Date of Patent: *Nov. 10, 1998

[54] STRESS TEST MODE

[75] Inventor: David Charles McClure, Carrollton, Tex.

[73] Assignee: STMicroelectronics, Inc., Carrollton, Tex.

[*] Notice: The term of this patent shall not extend beyond the expiration date of Pat. No. 5,629,943.

[21] Appl. No.: 172,854

[22] Filed: Dec. 22, 1993

[51] Int. Cl.⁶ .................................................. G11C 7/00
[52] U.S. Cl. ...................... 365/201; 365/190; 365/189.11
[58] Field of Search ................................ 365/201, 190, 365/154, 202, 189.11

[56] References Cited

U.S. PATENT DOCUMENTS

| | | | |
|---|---|---|---|
| 4,685,086 | 8/1987 | Tran | 365/201 |
| 5,132,929 | 7/1992 | Ochii | 365/201 |
| 5,166,608 | 11/1992 | Bowles | 365/201 |
| 5,629,943 | 5/1997 | McClure | 365/201 |

*Primary Examiner*—Vu A. Le
*Attorney, Agent, or Firm*—Theodore E. Galanthay; Kenneth C. Hill; Lisa K. Jorgenson

[57] ABSTRACT

Accelerated failure of processing defects in an integrated circuit memory device is brought about by asserting all wordlines of the memory device to enable all passgates for a plurality of memory cells. Then all bitlines are pulled low to pull low all internal nodes of the plurality memory cells. All active devices in the memory device are turned off or limited to linear region operation. This allows a supervoltage to be applied to the wordlines with internal nodes of the memory cells held low by the bitlines, stressing an oxide barrier between memory cells and wordlines without damaging active devices due to the supervoltage.

34 Claims, 5 Drawing Sheets

STRESS TEST MODE

CROSS REFERENCE TO RELATED APPLICATION

The subject matter of the present application is related to copending U.S. application Ser. No. 08/173,197, filed on even data herewith and titled "IMPROVED STATIC MEMORY LONG WRITE TEST", issued May 13, 1997 as U.S. Pat. No. 5,629,943, which is expressly incorporated herein by reference. The applications are commonly assigned.

BACKGROUND OF THE INVENTION

1. Field of the Invention

The present invention relates to the testing of memory devices and more particularly to the testing of static random access memory (SRAM) devices and first-in, first-out (FIFO) memory devices and other multiple port memories which are incorporated in integrated circuits.

2. Description of the Prior Art

The premature or infant failure of memory cells in integrated SRAMs, multiple port memories, FIFO memories and other memory products has been an unfortunate but all to common occurrence. Moreover, failure of such parts in the field is unacceptable to vendors of products incorporating integrated memory. As a result, nondestructive testing of all integrated circuits to expose and detect those integrated circuits subject to infant failure is dictated by the market.

One contemporary testing regimen is to place memory product in burn in oven to elevate temperature and then to exercise the device by varying applied voltages to the product. For some large capacity memory devices the period in the burn in oven has reached 96 hours which is required to test each of thousands of wordlines. Such long testing cycles pose an obvious bottleneck to production and are useless for generating up to the minute information about possible faults in the manufacturing process. An accelerated stress mode which works without damaging good memory product would have apparent benefits.

The common sources of defects in memory product and the difficulties posed in testing those products without damage are a product of the architecture. A simple static memory cell is connected to two bitlines by pass gate transistors, which it may be selectively turned on by the state of a wordline. The bitlines and the wordline are typically metallized strips. They must be electrically insulated from one another, as well as from the modified areas of semiconductor material which constitute the memory cells for the structure to work. Commonly, failure of devices may be traced to failure of isolation between metallized strips and nodes within the memory cells. Among specific problems which can occur in a device after being placed in use is that poor metallization may lead to local overheating and metal migration because of spot melting. Oxide layers used to isolate metallization lines from semiconductor devices and from other metallization lines may be too thin or incomplete possibly due to defects, thereby allowing oxide breakdown and failure of a device. Gate oxide layers are also subject to failure.

Stressing a memory product by application of overvoltages to the memory product is a way of accelerating aging of the device to expose defects likely to result in premature failure. Unfortunately, life is not so simple as to allow direct application of high voltage during exercise of the circuit. An integrated semiconductor device will have the devices that were designed for it, and other "parasitic" devices which are a byproduct of the various doped regions which have been built. The application of overvoltages, or current spikes during activation of the circuit under an overvoltage condition, can in result in activating these parasitic devices, and may damage them with unforeseen consequences for the device as a whole. Supervoltages may also cause active devices on the circuit to latch up if they are driven in their saturation region. In the prior art such limitations have limited testing to BVDII as an overvoltage, or about 7 volts for 5 volt circuitry, typically with long heating of the device in a burn in oven.

SUMMARY OF THE INVENTION

It is an object of the invention to provide a method for accelerated stressing of integrated circuit memory devices.

It is another object of the invention to allow application of increased voltages to integrated circuit memory devices without damaging active devices or activating parasitic devices.

The invention provides for these and other objects by providing a method for accelerating failure of processing defects in an integrated circuit memory device. Stressing is brought about by asserting all wordlines of the memory device to enable all passgates for a plurality of memory cells. Then all bitlines are pulled low to pull low all internal nodes of the plurality of memory cells. All active devices in the memory device are turned off or limited to linear region operation. This allows a supervoltage to be applied to the wordlines with internal nodes of the memory cells held low by the bitlines, stressing an oxide barrier between memory cells and wordlines without damaging active devices due to the supervoltage.

Sequencing selection of bitlines as low and high may also be done. All addresses may be deasserted to stress nodes in the opposite direction.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
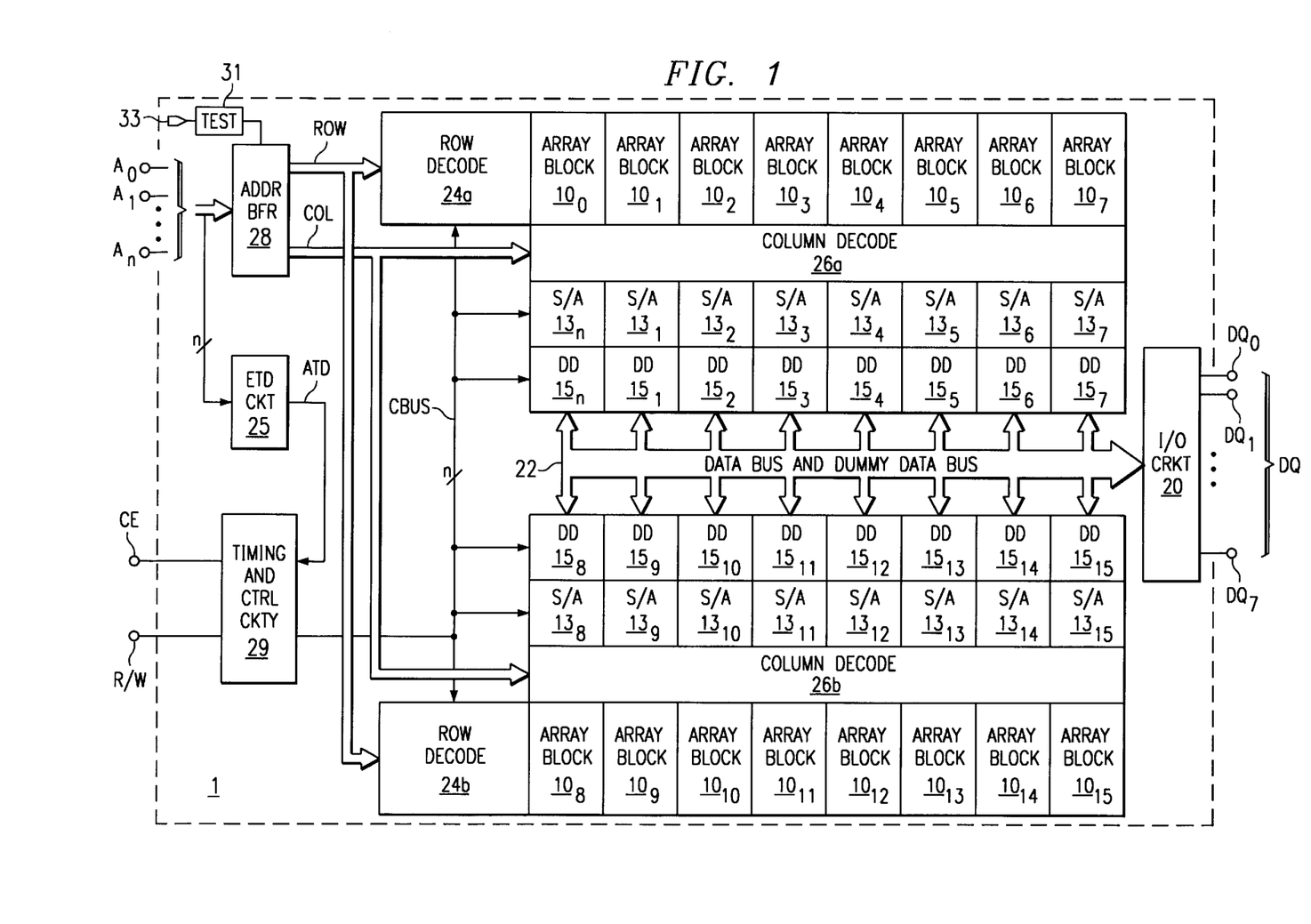
FIG. 1 is a block diagram of a static random access memory integrated circuit.

FIG. 1 illustrates an example of an integrated circuit (IC) memory 1 with which a preferred embodiment of the invention may be implemented. IC memory 1 is a static random access memory (SRAM) of otherwise conventional architecture, having its memory cells in multiple blocks 10.

Memory cells in IC memory 1 are arranged in rows and columns. It should be noted that the designation of rows and columns in memory 1 use the term row to refer to the array direction in which a plurality of memory cells are selected by way of a wordline. In conventional memories, each of the memory cells in the selected row are generally coupled to one or a complementary pair of bitlines. The term column is used in this description to refer to the array direction in which one or more of the memory cells in the selected row are selected for read or write access. In conventional memories, this is generally accomplished by coupling one of the bitlines to a sense amplifier/write circuit, or to an internal data bus. It is contemplated that such use of the terms and columns is consistent with the general understanding in the art.

Address terminals $A_0$ through $A_n$ receive an address signal according to which the memory cells to be accessed are designated. In the conventional manner, address terminals $A_0$ through $A_n$ are connected to address buffers 28, which buffer the received address signal and communicate a portion of the address signal to row decoders 24a, 24b on bus ROW, and communicate the remainder to column decoders 26a, 26b on bus COL. Address buffer 28 may also be used to exercise all column and row decoders during presence of a TST signal from test circuit 31. Test circuit 31 is enabled by grounding an input pad 33. Row decoders 24a, 24b select a row of memory cells by enabling the selected wordline in the conventional manner, and in this example are located along a side of the memory array blocks 10. Column decoders 26a, 26b, in this example, select eight memory cells in the selected row to be sensed by a sense amplifier 13 according to the column portion of the address.

In memory 1 the memory cells are grouped into sixteen primary array blocks $10_0$ through $10_{15}$. The number of array blocks 10 may, of course, vary from implementation to implementation. This partitioning of the memory into sixteen primary array blocks 10 is particularly beneficial in low power memories, such as may be used in portable computers, as only the block 10 in which the selected memory cells are located need be enabled during a cycle. In this example, each primary array block 10 includes 64 columns. Selection of the block may be done according to one of the row address bits (indicating upper or lower half) and to four of the column address bits (indicating one of sixteen primary array blocks 10 to be selected).

Alternatively, selection of a row within one of said primary array blocks 10 may be made by way of a global wordline generated by row decoders 24a, 24b, extending across those primary array blocks 10 for which it is operable. Pass gates by which memory cells within each of primary array blocks 10 are connected to their bitlines are, in this alternative arrangement, controlled by local wordlines which extend only within each primary array block 10 for each row portion therein. In this arrangement, pass transistors connected between each global wordline and the local wordlines are enabled according to a block portion of the column address, so that only the local wordline associated with the primary array block 10 selected by the column address is enabled, thus reducing the active power dissipation of each memory cycle. An example of such an arrangement is described in Sakurai, et al., "A Low Power 46 ns 256 kbit CMOS Static RAM with Dynamic Double Word Line", *IEEE J. Solid State Circuits*, Vol. SC-19, No. 5 (IEEE, October 1984), pp. 578–585.

Memory 1, as in the case of most modern SRAMs and DRAMs, may include some amount of dynamic operation, such as precharging and equilibration of certain nodes (e.g., bitlines) at particular points in the memory cycle. Initiation of the cycle in memory 1 occurs by way of address edge transition detection, performed by edge transition detection (ETD) circuit 25. ETD circuit 25 is connected to each of the address inputs $A_0$ through $A_n$, preferably prior to address buffers 28 (as shown), and generates a pulse on line ETD responsive to detecting a transition at any one or more of address inputs $A_0$ through $A_n$, such a pulse is useful in controlling the internal operation of memory 1 in the conventional manner.

Other internal operational functions are controlled by timing and control circuitry 29, which receives the signal on line ETD from ETD circuit 25, and which also receives certain external control signals such as the chip enable signal at terminal CE, and the read/write select signal at terminal R/W. Timing and control circuitry 29 generates various control signals based on these inputs, for control of the various functions within memory 1 in the conventional manner. As shown in FIG. 1, control bus CBUS is connected to sense amplifiers 13 and data drivers 15; other functions are similarly controlled by timing and control circuitry 29 in the conventional manner, with their connections not shown in FIG. 1 for purposes of clarity.

Memory 1 in this example is of the byte-wide type, and as such it has eight input/output terminals $DQ_0$ through $DQ_7$ at which output data is presented during a read operation, and at which input data is received during a write operation. Input/output circuitry 20 is connected between data bus 22 and terminals DQ, and includes conventional input and output buffers connected thereto.

Each of primary array blocks $10_0$ through $10_{15}$ is associated with a corresponding group of sense amplifiers $13_0$ through $13_{15}$, as shown in FIG. 1. In this example, eight individual sense amplifiers 13 are included within each group of sense amplifiers $13_0$ through $13_{15}$, one sense amplifier 13 for each of the eight bits to be communicated on internal data bus 22 from the selected one of primary array blocks $10_0$ through $10_{15}$. Groups of data drivers $15_0$ through $15_{15}$ are each associated with a corresponding group of sense amplifiers $13_0$ through $13_{15}$ for receiving the data signal therefrom and for driving internal data bus 22 therewith; individual data drivers 15 are associated with individual sense amplifiers 13 in each group, one data driver 15 for driving each line in data bus 22.

The memory array is also divided into halves, with primary array blocks $10_0$ through $10_7$ in one array half and primary array blocks $10_8$ through $10_{15}$ in the other half. Internal data bus 22 runs the length of the array halves, and is located therebetween as shown in FIG. 1. In this example, data bus 22 includes eight data conductors, each associated with an input/output terminal $DQ_0$ through $DQ_7$ and coupled thereto via input/output circuitry 20. Each individual data conductor is connected to a corresponding data driver 15 in each of the sixteen data driver groups $15_0$ through $15_{15}$ of the sixteen primary array blocks $10_0$ through $10_{15}$. For a read/write memory such as memory 1, a separate input data bus can be used to communicate input data to be written to the selected memory cells, in the conventional manner. Alternatively, the input data may also be communicated along data bus 22, as is conventional for some memory designs.

In this example, data bus 22 also includes eight dummy data conductors, each of which are also connected to a corresponding data driver 15 in each of the sixteen data driver groups $15_0$ through $15_{15}$ of the sixteen primary array blocks $10_0$ through $10_{15}$, for purposes of precharging data bus 22 by way of charge sharing. Each of these dummy data conductors preferably physically resembles one of the true data conductors, preferably having substantially the same length and cross-sectional area and being formed of the same material, and is maintained, at all times, at a complementary state relative to its true data conductor.

Figure 2:
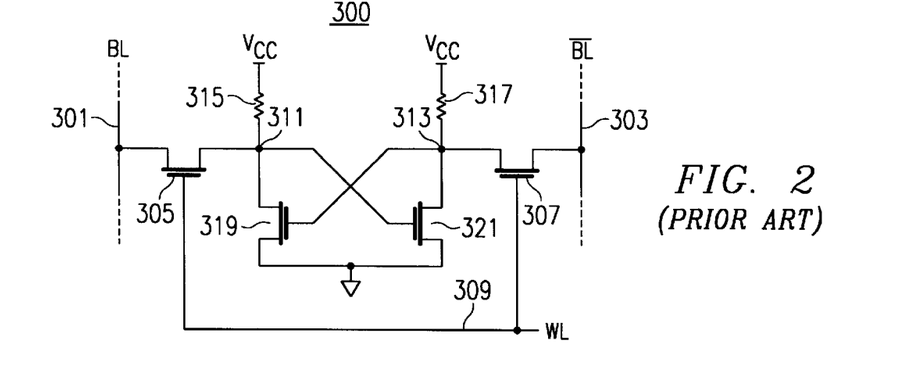
FIG. 2 is a circuit schematic of a prior art memory cell.

FIG. 2 is a prior art memory cell 300. Memory cell 300 is connected at nodes 311 and 313 to a bitline 301 and a bitline complement 303 by gating transistors 305 and 307, respectively. Gating transistors 305 and 307 are turned on and off in unison by the state of a signal on wordline 309. Nodes 311 and 313 are connected to $V_{CC}$ by polycrystalline silicon resistors 315 and 317, respectively, which typically have a resistance of about $10^{12}$ ohms. Otherwise, memory cell 300 is a completely conventional two n-channel transistor 319, 321 latch device. In normal operation either n-channel transistor 319 or 321 is conducting, but never both. When transistor 319 is conducting the signal level on node 311 is low, which in turn turns transistor 321 off. When transistor 321 is off node 313 assumes the value $V_{cc}$ through resistor 317. By asserting the wordline, bitline pair 301 and 303 may be used to force nodes 311 and 313 to different levels because of the weak conductance of resistors 315 and 317. Memory cell 300 will hold whatever levels are left on its respective internal nodes.

Failures of memory cell 300 can occur between one of internal nodes 311 or 313 and wordline 309. Other locations of failures include between bitline 301 or bitline complement 303 and wordline 309. Failures typically result from breakdown of oxide layers intended to insulate the nodes from the metallized bitlines or wordlines. Cell node to cell node and cell node to $V_{ss}$ failures can also occur. The methods of the present invention are intended to place an elevated supervoltage difference across critical parts of the oxide insulation without damaging active devices or causing their latch up to force quick failure of defective areas.

Figure 3:
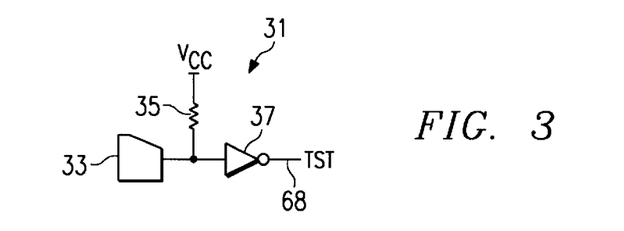
FIG. 3 is a circuit schematic of a test activation circuit.
Figure 4:
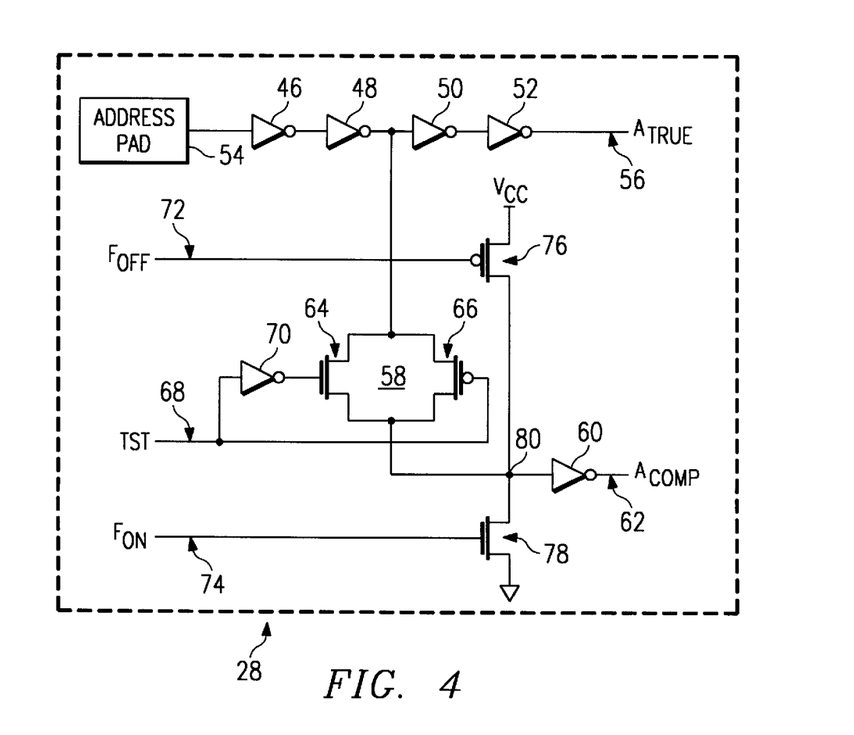
FIG. 4 is a circuit schematic of an address buffer for the static random access memory of FIG. 1.

FIG. 3 is a circuit diagram of a test circuit 31. Inputs to test circuit 31 may be applied before packaging of an integrated circuit incorporating the device to a pad 33. A test input is provided by grounding pad 33 to pull the voltage level thereon down from $V_{cc}$, which is otherwise available via leakage resistor 35. The signal level on pad 33 is inverted by inverter 37 to generate the test signal TST on line 68 to address buffer 28 (FIG. 4). Without connection of pad 33 to ground while the memory device is powered, the output of test circuit 31 is low.

FIG. 4 is a circuit diagram illustrating a circuit for address buffer 28. In order to simultaneously assert all wordlines and, where appropriate, to assert all column select lines, address buffer 28 is modified to provide a response equivalent to all addresses being simultaneously asserted. First inverter 46, second inverter 48, third inverter 50, and fourth inverter 52 are connected in series between an address pad 54 and a first output signal line 56, labelled $A_{TRUE}$. Connected to the output of second inverter 48 is an input into pass gate 58. Fifth inverter 60 is connected between the output of pass gate 58 and second output signal line 62, labelled $A_{COMP}$. Generally, $A_{TRUE}$ and $A_{COMP}$ are input into an address decoder (not shown).

Inverters 46, 48, 50, 52 placed between address pad 54 and first output signal line 56 are used to increase drive capacity for the signal $A_{TRUE}$. Inverters 46, 48, 50, 52 also result in a time delay for $A_{TRUE}$. In the preferred embodiment, pass gate 58 is used between second inverter 48 and fifth inverter 60 to make the time delay for $A_{COMP}$ equal to the time delay of $A_{TRUE}$, and to optimize the crossing point of $A_{TRUE}$ and $A_{COMP}$ during the transition.

As known in the art, pass gate 58 is composed of an channel transistor 64 and a p-channel transistor 66 with a common source and drain. Signal 68, labelled TST, is used to control pass gate 58. When the signal on TST is low, channel transistor 66 is turned on. Additionally, sixth inverter 70 inverts the signal and n-channel transistor 64 is turned on. With both transistors turned on, signal 72, labelled $F_{OFF}$, set high, and signal 74, labelled $F_{ON}$ set low, the pass gate conducts and $A_{COMP}$ and $A_{TRUE}$ are complementary signals.

The integrated circuit is preferably in a testing or special operating mode when both output signals $A_{COMP}$ and $A_{TRUE}$ are set to the same voltage level. To set both signals to the same voltage level, TST is set high. Address pad 54, signal 72, signal 74, pull up transistor 76 and pull down transistor 78 are then used to select the voltage level both $A_{COMP}$ and $A_{TRUE}$ are to be set to, as will be described in greater detail below.

For a first example, if both $A_{COMP}$ and $A_{TRUE}$ need to be high, a high voltage level is placed on address pad 54. This causes $A_{TRUE}$ to be at a high voltage level. To get $A_{COMP}$ to be at a high voltage level, $F_{OFF}$ and $F_{ON}$ are set to a high voltage level. This causes pull up transistor 76 to be turned off and pull down transistor 78 to be on. With pull down transistor 78 on, node 80 is set to a low voltage level, which fifth inverter 60 inverts to a high voltage level. Thus, both $A_{TRUE}$ and $A_{COMP}$ are set at a high voltage state.

If the address decoders (not shown) which have $A_{TRUE}$ and $A_{COMP}$ as inputs are composed of NAND gates, and these NAND gates are used to select rows (i.e. wordlines) in a memory array, then all of the NAND gates have a low voltage level as their output states. This causes all of the rows in the memory array to be selected. If the NAND gates are used as decoders for column selection in the memory array, then all of the columns in the memory array are selected in this same manner.

Alternatively, if both $A_{COMP}$ and $A_{TRUE}$ need to be at a low voltage level, a low voltage level is placed on address pad 54. This causes $A_{TRUE}$ to be a low voltage level. To get $A_{COMP}$ to be at a low voltage level, $F_{OFF}$ and $F_{ON}$ are set to a low voltage level. This causes pull up transistor 76 to be turned on and pull down transistor 78 to be turned off. With pull up transistor 76 on, node 80 is set to a high voltage level, which fifth inverter 60 inverts to a low voltage level. Thus, both $A_{TRUE}$ and $A_{COMP}$ are set at a low voltage state.

Continuing with this second example, if the address decoders (not shown) which have $A_{TRUE}$ and $A_{COMP}$ as inputs are composed of NAND gates, and these NAND gates are used to select rows in a memory array, then all of the NAND gates have a high voltage level as their output states. This causes all of the rows in the memory array not to be selected. If the NAND gates are used as decoders for column selection in the memory array, then all of the columns in the memory array are not selected in this same manner. Stress mode may select all or a portion of the row and bitlines at a single time. A plurality of rows are selected at one time and a stress voltage is placed on a plurality of bit and complementary bitlines. Memory cells within the memory array are then stress tested in order to detect latent defects. Another stress mode selects all or a portion of the row and bitlines at a single time. A plurality of rows and/or bitlines are simultaneously selected or deselected and a stress voltage is applied to the integrated circuit. In this manner, latent defects within the decoders and periphery circuits may be detected.

The above described address buffer supplies a means for providing a true or false stimulus to a number of row and/or column decoders. The address buffer provides an operation mode which simultaneously selects or deselects a plurality of rows and/or columns within a memory array. The preferred circuit is constructed so that it achieves equal time delays for $A_{TRUE}$ and $A_{COMP}$ and optimizes the crossing point of $A_{TRUE}$ and $A_{COMP}$ during normal operations. Additionally, the preferred circuit does not affect the normal operations of the integrated circuit and is compact, so it does not consume much area in the integrated circuit.

Figure 5:
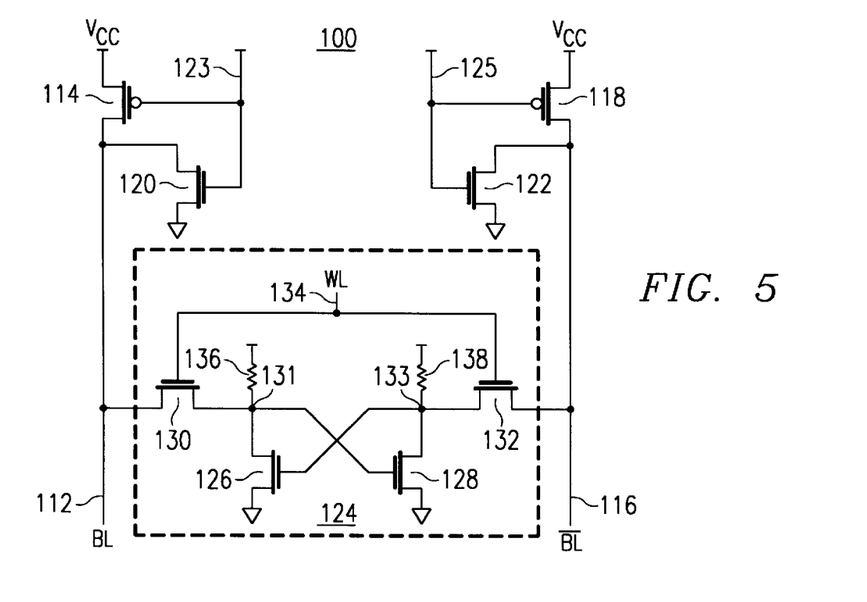
FIG. 5 is a circuit schematic of a memory cell and attendant access lines with which the method of the invention may be practiced.
Figure 6:
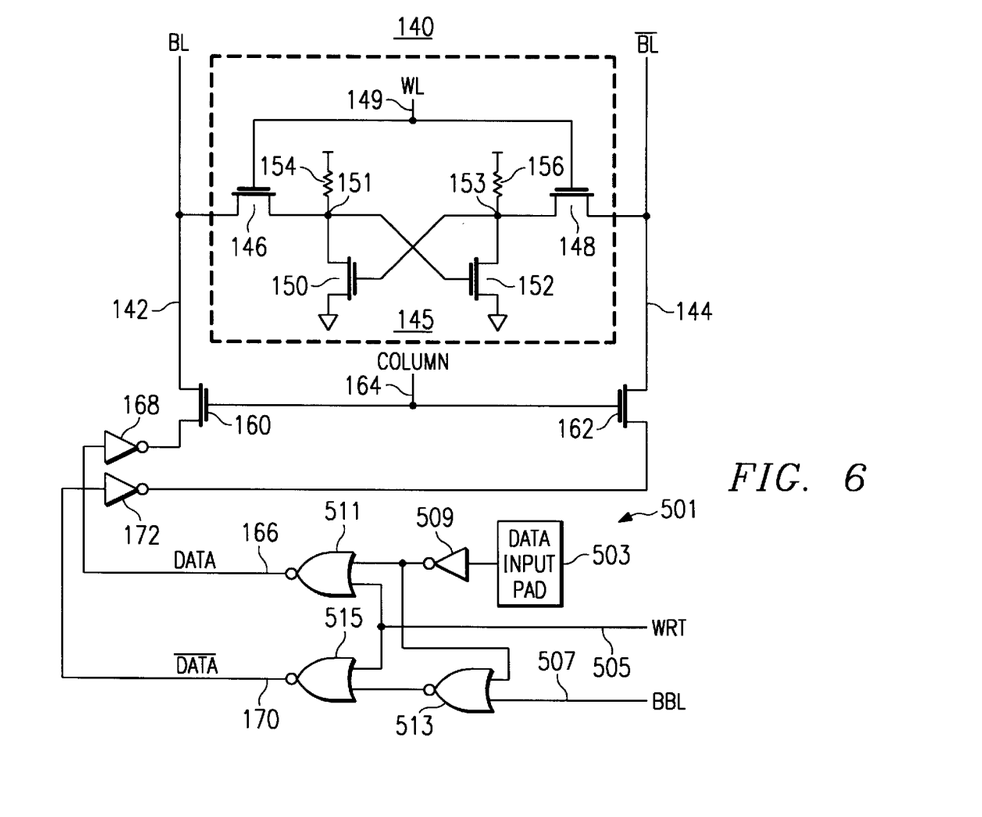
FIG. 6 is a circuit schematic of a memory cell and attendant access lines with which the method of the invention may be practiced.
Figure 7:
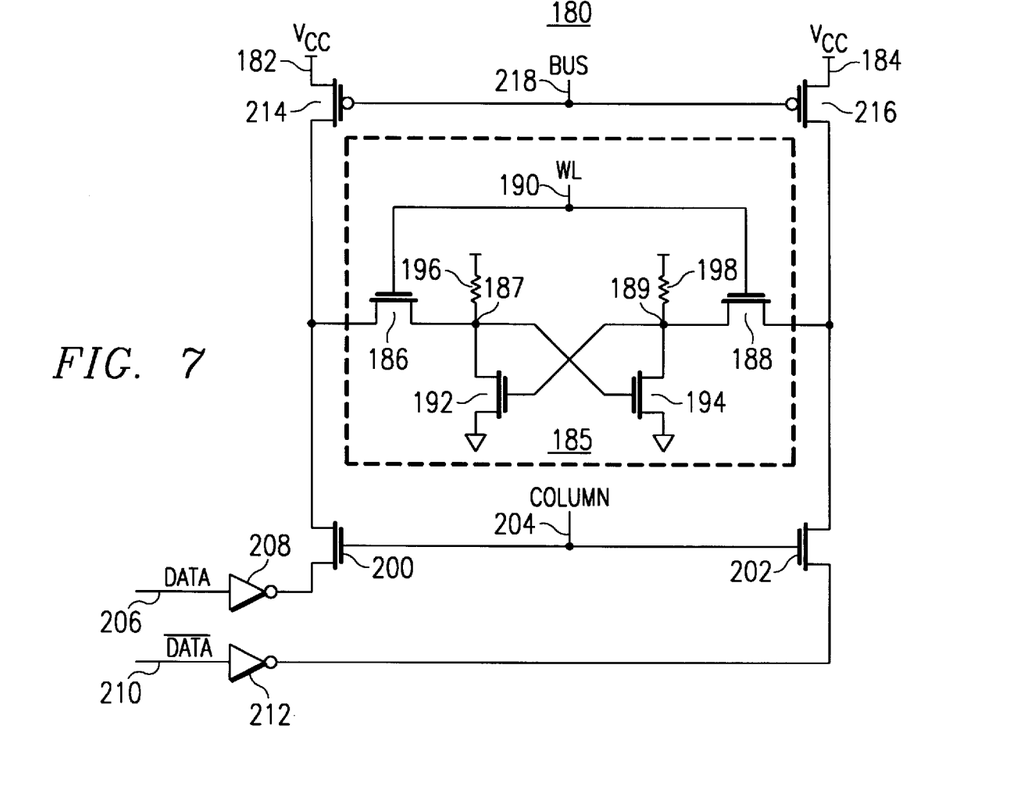
FIG. 7 is a circuit schematic of a memory cell and attendant access lines with which the method of the invention may be practiced.

FIGS. 5, 6 and 7 are circuit schematics of memory cells which may be incorporated into SRAM IC 1 for practicing the invention. Memory cell 100 is connected to bitline true 112, which has a bitline true load 114, and to bitline complement 116, which has a bitline complement load 118. The bitline true load 114 and bitline complement load 118 are implemented in p-channel transistors; one skilled in the art will recognize that n-channel transistors could serve as load devices as well. Additionally, memory structure 100 has pull-down transistor 120 connected to bitline true 112 and pull-down transistor 122 connected to bitline complement 116. Bus 123 is connected to the gates of bitline true load 114 and bus 125 bitline complement load 118, as well as to the gates of pull-down transistor 120 and pull-down transistor 122. When bus 123 is pulled to a logic high level, p-channel bitline true load 114 is turned off, and n-channel pull-down transistor 120 is turned on. When bus 125 is pulled to logic high then p-channel bitline complement load 118 is turned off, and n-channel pull-down transistor 122 is turned on. By control of busses 123 and 125 any desired combination of signal levels may be applied to the bitlines. For example, by synchronizing the signals on bus 123 and bus 125, bitline true 112 and bitline complement 116 are simultaneously pulled to a logic low level, typically ground. Also, one bitline of each pair may be placed low and the other high to allow stressing with multiple bitlines affected in various combinations of voltage levels on the bitline true and the bitline complement.

Memory cell 124 of memory structure 100 is of the Poly R Load type well known in the art and resides between bitline 112 and bitline complement 116. The Poly R Load memory cell 124 has n-channel transistor 130 whose source/drain is connected to bitline true 112, and n-channel transistor 130 whose source/drain is connected to bitline complement 116. The gates of n-channel transistors 130 and 132 are connected to and controlled by wordline signal 134. The source/drain connections of n-channel transistors 126 and 128 are connected to n-channel transistors 130 and 132, respectively, as shown and are pulled up to the memory cell supply voltage $V_{cc}$ through polycrystalline silicon resistors 136 and 138, respectively. Memory cell node 131 is defined as the electrical connection of n-channel transistors 126, 128, 130, and polycrystalline silicon resistor 136. Memory cell node 133 is defined as the electrical connection of n-channel transistors 126, 128, 132, and polycrystalline silicon resistor 138. While a Poly-R Load memory cell is shown, other types of memory cells such as a 6 Transistor memory cell may also be used in conjunction with the present invention.

Memory structure 100 is a standard structure with the exception of pull-down transistors 120 and 122 and the bitline load control afforded by busses 123 and 125. An SRAM which uses the present invention will contain a plurality of memory cells analogous in operation to memory cell 124. A FIFO memory cell or other multiple port memory will have at least one wordline. This means that the memory cells of an entire static memory array may incorporate the present invention or perhaps just a portion of the memory array with the method of the present invention may be practiced.

Referring to FIG. 6, a memory structure 140 is shown. Memory structure 140, similar to FIG. 5, has a Poly-R Load memory cell 14S which resides between bitline true 142 and bitline complement 144. Poly-R Load memory cell 145 has n-channel transistor 146 whose source/drain is connected to bitline complement 144. The gates of channel transistors 146 and 148, are connected to and controlled by the wordline signal 149. The source/drain connections of n-channel transistors 150 and 152 are connected to n-channel resistors 146 and 148, respectively, as shown and are pulled up to the memory cell supply voltage $V_{cc}$ through polycrystalline silicon resistors 154 and 156, respectively. Memory cell node 151 is defined as the electrical connection of n-channel transistors 146, 150, 152, and polycrystalline silicon resistor 154. Memory cell node 153 is defined as the electrical connection of n-channel transistors 148, 150, 152, and polycrystalline silicon resistor 156. While a Poly-R Load memory cell is shown, other types of memory cells, such as a 6 Transistor memory cell could also be used.

In conjunction with Poly-R Load memory cell 145, the second embodiment of the present invention features a bitline true passgate 160 and bitline complement passgate 162 whose gates are connected to and controlled by column decode signal 164. The source/drain of passgate 160 is connected to write driver 168 which has Data signal 166 as its input signal, and the source/drain of passgate 162 is connected to write driver 172 which as Data Complement signal 170 as its input signal.

Write drivers 168 and 172 receive Data signal 166 and Data Complement signal 170 from a data input buffer 501. Data input buffer 501 includes a data input pad 503 and is, in normal operation, responsive to a write signal (WRT) 505 to enter a write mode. WRT is low for write mode and high for a read mode (which leaves both the Data and Data Complement signals low). A write node can be made active concurrent with driving both of bitlines 142 and 144 low by assertion of a both bitlines low signal (BBL) 507 and setting WRT low. This results in the Data and Data Complement signals being high. TTL buffer 509 provides for inversion of the data input signal. The output of buffer 509 is applied to one input of NOR gate 511, which also takes as an input WRT. The output of buffer 509 and the BBL signal also provide the inputs to NOR gate 513. The output of NOR gate 513 and the WRT signal provide the inputs to NOR gate 515 to produce the Data Complement signal.

The column of memory structure 140 is turned on by setting column decode signal 164 to a logic high level. Consequently, Data signal 166 and Data Complement signal 170 both go to a logic high level to pull both bitlines low by using the column decode path and write drivers 168 and 172, respectively. Setting both Data signal 166 and Data Complement signal 170 to a logic high requires overriding the data in buffer of memory structure 140, which is not shown here. In this way, bitline true 142 and bitline complement 144 may be pulled to a logic low.

During stress mode, with wordlines asserted, bitline true 142 and bitline complement 144 may be simultaneously pulled to a logic low level to test pass gates 146 and 148. The logic low level may be provided by write drivers 168 and 172. Setting both Data signal 166 and Data Complement 170 to a logic high requires overriding the data-in buffer of memory structure 140. Again, bitlines may be stressed through a sequence of levels. By enabling the column decode path, exercise of the column decode paths may be done to stress oxides for that circuitry.

The embodiments shown in FIGS. 5 and FIG. 6 offer several advantages. Memory structures 100 and 140 allow the bitline true and bitline complement of a memory cell to be pulled to a logic low level. The memory structure 140 of FIG. 6 accomplishes these goals without using the pull-down n-channel transistors show in FIG. 5. Additionally, the memory structure 140 of FIG. 6 offers the advantage of producing small current transient conditions. Switching currents are limited by write drivers 168 and 172 which can service multiple columns.

The memory structure 180 of FIG. 7 may be used in place of the memory structure of FIG. 6 if it is necessary to turn off the bitlines loads of the memory structure. Analogous to FIG. 6, Poly R Load memory cell 185 has n-channel transistor 186 whose source/drain is connected to bitline true 182, and n-channel transistor 188 whose source/drain is connected to bitline complement 184. The gates of n-channel transistors 186 and 188 are connected to and controlled by the wordline signal 190. The source/drain connections of n-channel transistors 192 and 194 are connected to n-channel transistors 186 and 188, respectively, as shown and are pulled up to the memory cell supply voltage $V_{cc}$ through polycrystalline silicon resistors 196 and 198, respectively. Memory cell node 187 is defined as the electrical connection of n-channel transistors 186, 192, 194, and polycrystalline silicon resistor 196. Memory cell node 189 is defined as the electrical connection of n-channel transistors 188, 192, 194, and polycrystalline silicon resistor 198.

As in FIG. 6, the source/drain of passgate 200 is connected to write driver 208 which as Data signal 206 as its input signal, and the source/drain of passgate 202 is connected to write driver 212 which as Data Complement signal 210 as its input signal. The column of memory structure 180 is turned on by setting column decode signal 204 to a logic high level. Consequently, Data signal 206 and Data Complement signal 210 both go to a logic high level to write by using the column decode path and write drivers 208 and 212, respectively. Setting both Data signal 206 and Data Complement signal 210 to a logic high requires overriding the data-in buffer (not shown here) in memory structure 180. In this way, bitline true 182 and bitline complement 184 are pulled to a logic low level at the same time. The columns of a memory block or the entire memory array of an SRAM may all be turned on. The addition of bus 218, which controls the gates of p-channel bitline true load 214 and p-channel bitline complement load 216, respectively, allows the bitline true 182 and bitline complement 184 of memory structure 180 to be pulled to a logic low level with no DC current by turning off bitline loads 214 and 216.

Parallel memory cell stress testing is preferably done at a voltage level about 4 volts above normal operating voltage, or 9 volts for a 5 volt device, and is directed to forcing oxide failures where processing is defective. Failures of oxide insulation is a main contributor to high FIT rates. These failures include memory cell node to bitline failures, memory cell node to wordline failures, bitline to bitline failures, bitline to wordline failures, cell node to $V_{ss}$ failures, etc. Exercise of the memory device will locate defective location after stressing is completed.

The features of the architecture used to carry out the stressing aspects of the invention include: (1) the ability to turn on all wordlines simultaneously; (2) the ability to keep all transistors out of saturation (they are in cutoff or operate in the linear region); and (3) the cutoff of all significant DC current paths (except for the polycrystalline silicon resistors). Factors 2 and 3 help in avoiding the BVDII limitation and allowing use of BVDSS as a voltage limit to stress the memory device. BVDII relates to transient snapback while the transistor is operating in SATURATION. BDVSS is transistor punch through voltage, which then becomes the limiting voltage. BVDSS is typically at least 2.5 volts greater than BVDII. Stress mode is entered as the device powers up from very low $V_{cc}$ levels which limits current transients.

For parallel memory cell testing, the address path is conditioned to provide a selecting condition for all or a group of addresses, meaning selection of all corresponding rows, and for the circuits of FIGS. 6 and 7, all corresponding columns. All bitline loads are driven into cutoff prior to application of the supervoltage on the wordlines and column select lines. For FIGS. 6 and 7, a write driver is used to obtain various conditions on the bitlines for the test. In one aspect of stress application, all bitline true and bitline complements of a memory device are pulled to $V_{ss}$, allowing simultaneous stress testing between all memory cell internal nodes, which are pulled to $V_{ss}$ via the active pass gates for each memory cell, and the wordlines asserted at the supervoltage. Having both internal nodes of a memory cell simultaneously low is normally unobtainable. In this manner a voltage difference of about 9 volts may be applied across the oxide layer between both internal nodes of an otherwise conventional memory cell and a wordline.

Figure 8:
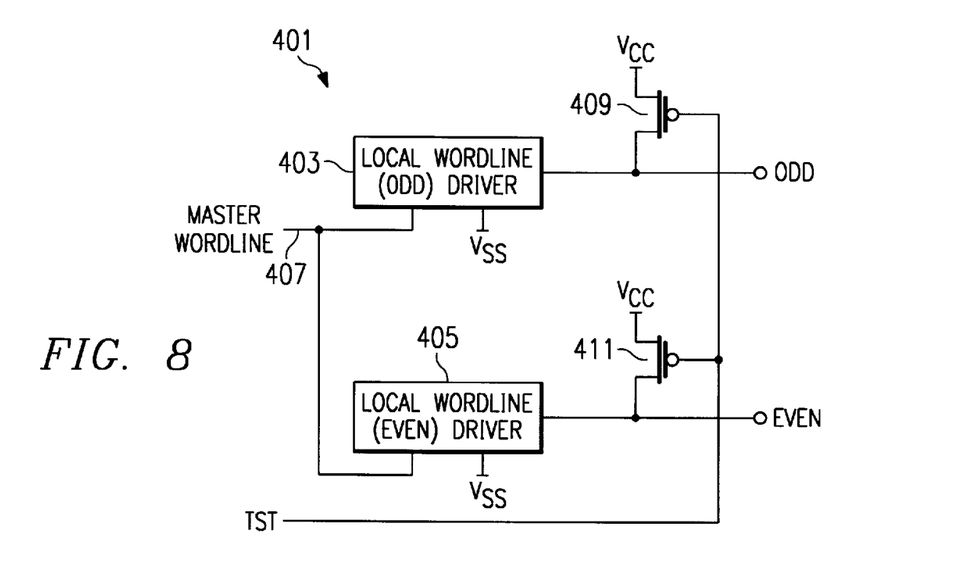
FIG. 8 is a mixed block diagram and circuit schematic of a local wordline driver for a static random access memory device as modified to practice the invention.

Devices need to be taken out out of saturation and DC current paths turned off at various points of IC 1. FIG. 8 illustrates a local wordline driver 401 such as may be incorporated in IC memory circuit 1. Driver 401 includes an odd local wordline driver 403 and an even local wordline driver 405 both of which are driven, in normal operation, by the state of a master wordline 407. Drivers 403 and 405 include active devices subject to latching up in the event of application of a supervoltage and accordingly are deactivated during stressing of IC 1. Transistors 409 and 411 in normal operating provide static loads on the outputs of drivers 403 and 405, respectively. Turning them off eliminates D.C. current paths through the drivers.

Figure 9:
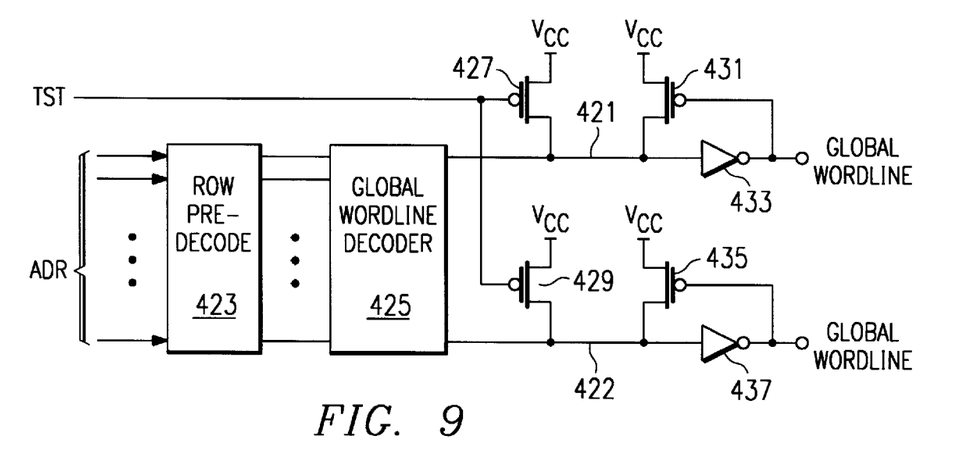
FIG. 9 is a mixed block diagram and circuit schematic of a global wordline decoder and driver for a static random access memory device as modified to practice the invention.

FIG. 9 illustrates a global wordline decoder and driver 425 for which current paths and saturated transistors are disabled during stress of IC 1. Decoder 425 operates on the output of a row predecoder 423. During stressing of IC 1 control transistors 427 and 429 are driven into cutoff by a positive going TST signal. An output latch formed into node 421 by transistor 431 and inverter 433 is disabled from latching by placing the $V_{cc}$ source at ground during stress mode. The output latch formed into node 422 by transistor 435 and inverter 439 is handled in an identical manner. Thus global wordlines in IC 1 are asserted during stress mode with no contention of latched transistors and static loads. This avoids contention when multiple wordlines are asserted between the global wordline decoder and transistors 431 and 435, which removes current spikes resulting from multiple wordlines turning on.

Figure 10:
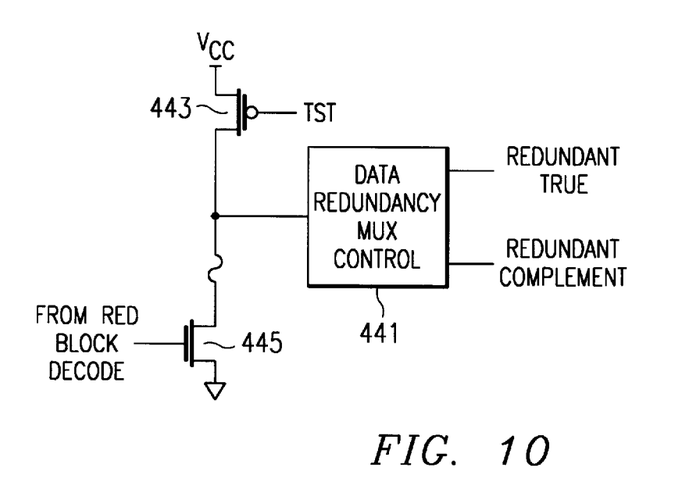
FIG. 10 is a mixed block diagram and circuit schematic of a data redundancy multiplexor control circuit for a static random access memory device as modified to practice the invention.

FIG. 10 illustrates data redundancy multiplex controller 441 which is responsive to assertion of a redundant block decode signal received on the gate of transistor 445. In the absence of assertion of the signal the input to controller 441 is high. With TST high transistor 443 is off so that no DC current flows through transistor 443 regardless of whether the redundant block control signal is asserted. Also sense amplifiers are turned off and output drivers are disabled to exhibit a high output impedance. The input address and control signals are at the supply rails, i.e., $V_{ss}$ or $V_{cc}$. Inputs are static during stress mode. Because no inputs are switching no transistors are switching during stress mode.

Other combinations of signals may be used to stress other parts of the memory device. According to one aspect of the stress regimen is leaving one of the bitline true or bitline complement pair high to each memory cell, but pulling the other bitlines to $V_{ss}$. This operates to stress the holding one side of the memory cell high through a low impedance pass gate to a bitline. This aspect of stressing is done with all of the bitlines true held high followed by holding of the bitlines complement high, or vice versa.

Finally both bitlines may be forced high and the wordlines left low to further test the pass gates. All addresses are deasserted to stress oxide layers throughout the address path and periphery with the opposite logic level. Generally, use of a burn in oven may be dispensed with. For all stress modes however, placing the device in a burn in oven can further reduce the time under supervoltage required.

Upon initial power up, the memory cells are in an indeterminent state. A data pattern may be written on the memory cells, say all 0's, before entering the stress mode at low $V_{cc}$ levels. All outputs should assume a high impedance based on stress mode entry. Effectively, a NOR gate is formed from the outputs of the devices, such that a pull up resistor on the burn in board pulls all outputs high, since all output impedances show a high output impedance if in stress mode. If even one device fails to enter stress mode, the output is pulled low. Thus, it can be detected if at least one device does not properly enter stress mode and hence wouldn't be properly stressed.

Additional testing may be provided by deselecting all wordlines to stress the array as well as the periphery circuitry when placed in the opposite state. Busses which are unused during stress testing can be forced into complementary states for stress testing in each of two directions. During deselection, bitlines may be placed in high and low states for testing. A supervoltage may be applied to the array $V_{cc}$ and to a wordline $V_{cc}$. Doing so would however require triple well processing for isolation and thereby avoid parasitic devices based on forward biased junctions.

By stressing a memory device with all wordlines selected, effective stress time is reduced as against the prior art where they were tested one at a time. In a 1 Megabyte SRAM, there are 8192 local wordlines resulting in a factor of improvement of 8192 times. By avoiding saturating any transistors and eliminating any DC current path of consequence, voltages applied may be increased. The net effect is that stress evaluation is improved by 6 fold order of magnitude in terms of time expended. Burn in time may be reduced from as much as 96 hours to less than 1 hour, or even a few seconds. Latch up fall out can also be greatly reduced.

Stress mode may also be entered with IC 1 in write mode to accomplish bitline control. This can accomplish turning off the sense amplifier and leaving the output impedance high. Periphery testing with all wordlines off can also be done. Stress testing may or may not be done with the IC in write mode. The IC can be disabled to allow stressing the write and enable the control circuitry both ways.

Stress mode may be entered when the device is powered up, with a ramping voltage applied up to the supervoltage. Further, if desired, the device can be powered down after a predetermined time span, followed by driving the supervoltage up again with the device in another stress mode. For example, the earlier described modes in which one bitline of each pair is driven high while the other is driven low could be alternated. This could give three consecutive test modes, with the first having both bitlines of each pair driven high. In the second and third modes, each bitline of each pair would alternatively be driven high and low. Each test mode would end by powering down the device, followed by ramping back up to the supervoltage after the logic state on the bitlines is changed. A following fourth stress mode could then be entered by driving the bitlines high and the wordlines low, followed by ramping back up to the supervoltage.

While the invention has been particularly shown and described with reference to a preferred embodiment, it will be understood by those skilled in the art that various changes in form and detail may be made therein without departing from the spirit and scope of the invention.

What is claimed is:

1. A method of stressing an integrated circuit memory device, comprising:

asserting a plurality of address paths concurrently to enable a plurality of wordlines in the memory device; and pulling all true and complementary bitlines, which are connected to memory cells activated by the plurality of wordlines, low to pull low all internal nodes of the memory cells.

2. The method of stressing an integrated memory device as set forth in claim 1, and further comprising:

turning off or limiting all active devices in the integrated memory device to linear region operation.

3. The method of stressing an integrated memory device as set forth in claim 2, further comprising:

driving the plurality of wordlines at a supervoltage.

4. The method of stressing an integrated memory device as set forth in claim 2, wherein the steps of asserting and pulling are parts of a stress mode, the method further comprising:

entering the stress mode on power up and ramping voltage applied to the memory device up to a supervoltage.

5. The method of stressing an integrated circuitry as set forth in claim 3 when a supervoltage greater than BVDII is applied.

6. (amended) The method of stressing an integrated memory device as set forth in claim 5, wherein the step of turning off includes turning off a plurality of bitline loads.

7. The method of stressing an integrated memory device as set forth in claim 6, and further comprising:

after expiration of a predetermined span of time in a prior stress mode, if any, powering down;

driving either the true or complementary bitline of each bitline pair high while leaving a remaining bitline low while ranging power up; and entering a second stress mode by ramping power up to the supervoltage.

8. A method of stressing an integrated memory device as set forth in claim 7, and further comprising:

after expiration of a predetermined span of time in a prior stress mode, if any, powering down;

driving the remaining bitline of each bitline pair high and returning the bitline which was previously driven high to a low logic state; and entering a third stress mode by ramping power up to the supervoltage.

9. A method as set forth in claim 8, and further comprising:

after expiration of a predetermined span of time in a prior stress mode, if any, powering down;

driving all bitlines high;

driving the wordlines low; and entering a fourth stress mode by ramping power up to the supervoltage.

10. A method of stressing an integrated circuit as set forth in claim 9, wherein all addresses are deasserted.

11. A method of stressing an integrated circuit as set forth in claim 9, wherein normal operation of the integrated circuit is disabled.

12. A method of stressing an integrated memory device as set forth in claim 9, wherein the stress mode, the second stress mode, the third stress mode and the fourth stress mode may be entered in any order.

13. A method of stressing an integrated circuit as set forth in claim 9, wherein a subset of the first, second, third and forth stress modes is done in any order.

14. A method of stressing an integrated memory device as set forth in claim 5, and further comprising:

prior to entering the stress mode, elevating the temperature of the memory device in a burn in oven above ambient.

15. A method of stressing an integrated memory device as set forth in claim 12, and further comprising:

prior to entering the stress mode, elevating the temperature of the memory device in a burn in oven above ambient.

16. A method of stressing an integrated memory device as set forth in claim 1, wherein the step of asserting all address paths further includes:

enabling column selects to all memory cells.

17. A method of stressing an integrated memory device as set forth in claim 16, and further comprising:

turning off or limiting all active devices in the integrated memory device to linear region operation.

18. A method of stressing an integrated memory device as set forth in claim 17, further comprising:

driving the plurality of wordlines at a supervoltage greater than BVDII.

19. A method of stressing an integrated memory device as set forth in claim 17, wherein the steps of asserting and pulling are parts of a stress mode, the method further comprising:

entering the stress mode on power up and ramping voltage applied to the memory device up to a supervoltage.

20. A method of stressing an integrated memory device as set forth in claim 19, wherein the integrated memory device is a static random access memory.

21. A method of stressing an integrated memory device as set forth in claim 9, and further comprising varying a bitline sequence applied to the memory cells for each of the first, second, third and fourth stress modes.

22. A method of stressing an integrated memory device as set forth in claim 19, wherein the stress mode is entered in a write mode.

23. A method of stressing an integrated memory device as set forth in claim 20, wherein the supervoltage is greater than BVDII.

24. A method of stressing an integrated circuit memory device, comprising:

asserting all wordlines to enable all passgates for a plurality of memory cells in the integrated memory device; and turning off or limiting all active devices in the integrated memory device to linear region operation.

25. A method of stressing an integrated circuit memory device as set forth in claim 24, and further comprising:

applying a supervoltage greater than BVDII to the integrated circuit memory device.

26. A method of stressing an integrated circuit memory device as set forth in claim 25, and further comprising:

pulling all bitlines low to pull low all internal nodes of the plurality memory cells.

27. A method of stressing an integrated circuit memory device as set forth in claim 25, and further comprising:

enabling all column selects.

28. A method of stressing an integrated circuit memory device as set forth in claim 25, and further comprising:

heating the integrated circuit memory device in a burn-in oven.

29. A method of stressing an integrated circuit memory device as set forth in claim 25, and further comprising:

ramping up voltage applied to the integrated circuit memory device to the supervoltage.

30. A method of stressing an integrated circuit memory device as set forth in claim 25, and further comprising:

varying a sequence of pulling various combinations of bitlines low to pull low a plurality of internal nodes of the plurality memory cells.

31. A method of stressing an integrated circuit memory device as set forth in claim 27, and further comprising:

controlling the bitlines by write driver circuitry.

32. A method of stressing an integrated circuit memory device as set forth in claim 25, and further comprising:

deasserting all of a plurality of address lines.

33. A method of stressing an integrated circuit memory device as set forth in claim 28, and further comprising:

flagging an integrated circuit memory device in a burn in oven which has not entered stress mode.

34. A method of stressing an integrated circuit memory device as set forth in claim 24, and further comprising:

overriding data in an input/output buffer to bring all bitlines in the integrated circuit memory device low.

* * * * *